(12) United States Patent
Kleiman

(10) Patent No.: US 6,888,658 B2
(45) Date of Patent: May 3, 2005

(54) METHOD AND GEOMETRY FOR REDUCING DRIFT IN ELECTROSTATICALLY ACTUATED DEVICES

(75) Inventor: Rafael Nathan Kleiman, Millburn, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 275 days.

(21) Appl. No.: 10/158,807

(22) Filed: May 31, 2002

(65) Prior Publication Data

US 2003/0232458 A1 Dec. 18, 2003

(51) Int. Cl.[7] .............................. G02F 1/03; G22F 1/07
(52) U.S. Cl. ....................... 359/245; 359/254; 359/290
(58) Field of Search ................................. 359/245–247, 359/251–252, 254–255, 290–291

(56) References Cited

U.S. PATENT DOCUMENTS

| | | | | |
|---|---|---|---|---|
| 6,130,627 A | * | 10/2000 | Tyburski et al. | 340/933 |
| 6,243,194 B1 | * | 6/2001 | Brazas et al. | 359/290 |
| 6,326,625 B1 | * | 12/2001 | Zur | 250/370.09 |
| 6,624,084 B2 | * | 9/2003 | Maeda et al. | 438/732 |

* cited by examiner

*Primary Examiner*—Jordan M. Schwartz
*Assistant Examiner*—Jessica Stultz

(57) ABSTRACT

A method and geometry for reducing drift in an electrostatically actuated device, the electrostatically actuated device including a dielectric material, for insulating conducting sections from a ground, the conducting sections being used to generate an electric field for controlling thereby the electrostatically actuated device includes, configuring a geometry of the dielectric material such that the electric field applied to exposed dielectric material comprises a substantially homogeneous electric field.

18 Claims, 5 Drawing Sheets

100

PRIOR ART

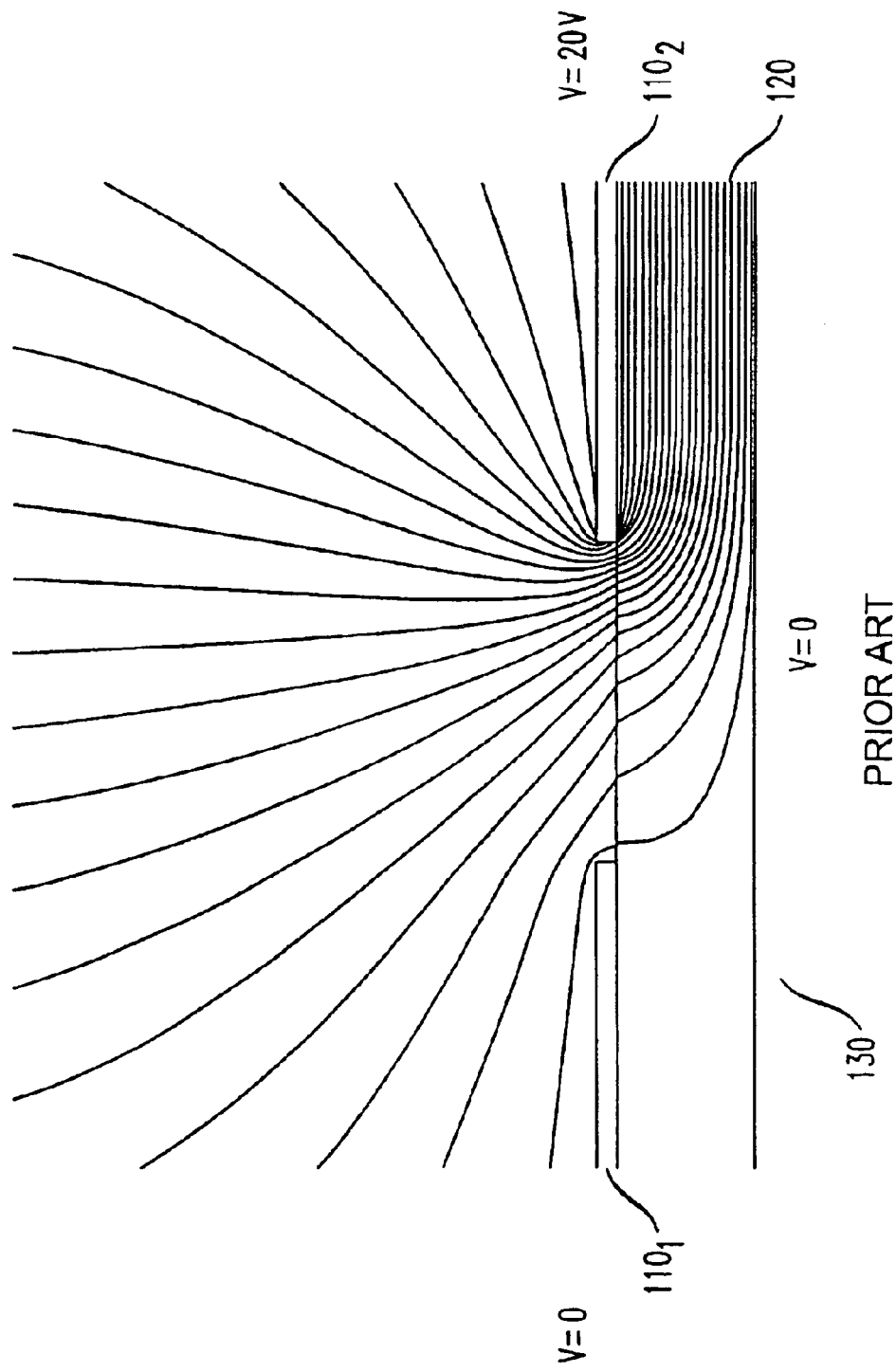

METHOD AND GEOMETRY FOR REDUCING DRIFT IN ELECTROSTATICALLY ACTUATED DEVICES

FIELD OF THE INVENTION

This invention relates to the field of electrostatically actuated devices and, more specifically, to drift in the properties of micro electromechanical systems (MEMS) devices.

BACKGROUND OF THE INVENTION

Early generations of micro electromechanical systems (MEMS) devices have shown considerable drift in their properties over time. One significant manifestation of drift is that when mirrors are actuated at full voltage (~200V) to achieve maximum tilt (~6°) the angle of the mirror subsequently drifts by as much as 0.5° with a long time constant, approaching days. This is unacceptable performance for MEMS devices in optical systems such as an optical cross-connect (OXC), where mirror stability is essential to maintain optical throughput. In such cases, the magnitude of drift is such that it may not even be possible to maintain an established channel, even with reasonable feedback mechanisms.

Drift in MEMS devices also affects other aspects of optical systems such as mirror "training"; the determination of the matrix elements required to route an optical input channel to an output channel. If the drift magnitude is substantial and/or the drift time constant is long, the training time becomes much longer and the training method more complicated, thus the cost of the system increases dramatically. Additionally, in operation, significant drift in an OXC compromises switching time and requires additional control mechanisms to maintain optimum optical throughput during the settling time.

One current solution to reducing the deleterious effects of drift in MEMS devices includes the implementation of shielding of the insulating region from the movable MEMS element. This method though, is not completely effective or reliable and adds cost to the MEMS devices.

SUMMARY OF THE INVENTION

The invention provides a method and geometry for reducing drift in electrostatically actuated devices. Part of the invention rests in the inventors insights into the mechanisms contributing to or causing such drift.

In one embodiment of the present invention, a method for reducing drift in an electrostatically actuated device, the electrostatically actuated device including a dielectric material, for insulating conducting sections from a ground, the conducting sections being used to generate an electric field for controlling thereby the electrostatically actuated device includes, configuring a geometry of the dielectric material such that the electric field applied to exposed dielectric material comprises a substantially homogeneous electric field.

In another embodiment of the present invention, a geometry for reducing drift in an electrostatically actuated device, the electrostatically actuated device including a dielectric material, for insulating conducting sections from a ground, the conducting sections being used to generate an electric field for controlling thereby the electrostatically actuated device includes, the dielectric material, configured such that the electric field applied to exposed dielectric material comprises a substantially homogeneous electric field.

In another embodiment of the present invention, an electrostatically actuated device includes a dielectric material, for insulating conducting sections from a ground, the conducting sections being used to generate an electric field for controlling thereby the electrostatically actuated device, wherein a geometry of the dielectric material is adapted such that when the electric field is applied to the exposed dielectric material, the electric field does not substantially change thereafter.

BRIEF DESCRIPTION OF THE DRAWINGS

The teachings of the present invention can be readily understood by considering the following detailed description in conjunction with the accompanying drawings, in which:

FIG. 2a graphically depicts a potential profile of the MEMS device of FIG. 1 in operation;

To facilitate understanding, identical reference numerals have been used, where possible, to designate identical elements that are common to the figures.

DETAILED DESCRIPTION OF THE INVENTION

The present invention will be described within the context of a micro electromechanical systems (MEMS) device. However, it will be appreciated by those skilled in the art that the subject invention may be advantageously employed to provide a means for reducing drift in a variety of electrostatically actuated devices. Thus, it is contemplated by the inventors, that the subject invention has broad applicability beyond the MEMS devices described herein.

Figure 1:
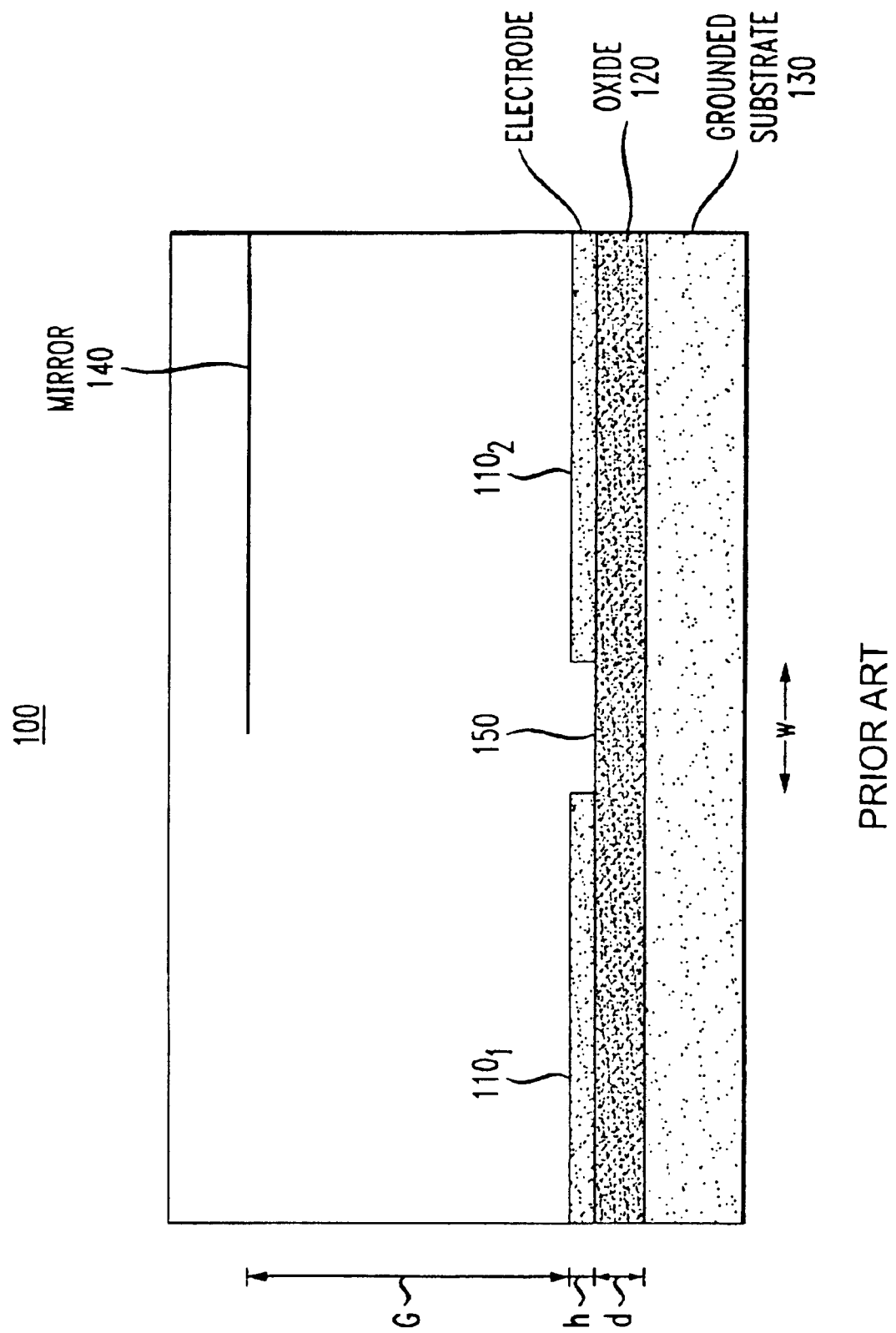
FIG. 1 depicts an embodiment of a conventional electrode geometry utilized in typical MEMS devices.

FIG. 1 depicts an embodiment of a conventional electrode geometry utilized in typical MEMS devices. MEMS devices are devices wherein part of a small structure can be accurately positioned by an electrostatic force resulting from a potential difference between two conducting sections. The MEMS device 100 of FIG. 1 includes two electrodes $110_1$ and $110_2$ as the conducting sections, a dielectric layer (illustratively a $SiO_2$ layer) 120, a grounded substrate 130, and an electrostatically actuated device (illustratively a mirror) 140. A gap 150 between the two electrodes $110_1$ and $110_2$ separates the conducting sections and exposes the dielectric layer 120. The gap 150 is defined in terms of width (w) of the exposed dielectric layer 120 and depth (d) of the exposed dielectric layer 120. The space in height (G) between the electrodes $110_1$ and $110_2$ and the mirror 140, and the electrode thickness (h) are also illustrated in FIG. 1.

Briefly stated, in operation a high voltage is applied to one of the electrodes of the MEMS device 100 while the other electrode and the grounded substrate 130 are kept at a lower potential. The dielectric layer 120 insulates between the actuation voltage and ground. The amount of voltage applied to the electrode in the high state determines the amount of tilt or torque applied to the electrostatically actuated device (i.e., a mirror) 140. The gap 150 between the electrodes is very small, typically in the range of 2–10 μm, but must be kept large enough to prevent leakage of the potential from the electrode at the high potential to the electrode at the low potential. Another factor that determines the amount of torque applied to the electrostatically actuated device 140 is the space in height (G) between the electrodes $110_1$ and $110_2$ and the electrostatically actuated device 140. Unfortunately, MEMS devices utilizing the conventional electrode geometry of FIG. 1 often show appreciable drift in the position of the electrostatically actuated devices as a function of time.

Through extensive research and testing, the inventor discovered that the charging and discharging of the oxide material used as the primary dielectric in MEMS devices is the major component leading to the drift in MEMS devices. In MEMS devices, there must always be a dielectric material, in this case a form of $SiO_2$, which insulates between the actuation voltage and ground. The surface of the dielectric is ideally insulating, but when exposed to large potentials for extended periods of times, acts as a conductor, albeit a poor one. The drift in MEMS devices is ultimately caused by a change in a torque applied to the electrostatically actuated devices caused by a time-varying charge in the exposed dielectric layer in the electrode gap.

FIG. 2a graphically depicts a potential profile of the MEMS device 100 of FIG. 1 in operation. The substrate 130 and one electrode (illustratively electrode $110_1$) are grounded and a voltage (20V) is applied to the other of the electrodes (illustratively electrode $110_2$). The width (w) of the gap in this case is illustratively 10 μm. Gap widths (w) for the conventional electrode geometry of the MEMS device 100 of FIG. 1 typically range from 2–10 μm, but are maintained large enough to prevent leakage of the potential from the electrode at a high potential to the electrode at a low potential. The resulting potential profile depicted in FIG. 2a clearly illustrates an inhomogeneity of the electric field in the electrode gap during the operation of the MEMS device 100. The electric field is more heavily concentrated to the right of center of the gap peaking closer to the electrode $110_2$ at the high potential. The effect of the inhomogeneous electric field in the electrode gap is a charging of the dielectric layer 120 of the MEMS device 100 of FIG. 1. The larger the gap that is maintained to prevent leakage, the more inhomogeneous the electric field in the gap and ultimately, the greater the charging of the dielectric layer 120. To test this phenomenon, the voltage to the electrode $110_2$ was removed after 40 minutes and the remaining charge on the dielectric layer 120 was profiled.

Figure 2B:
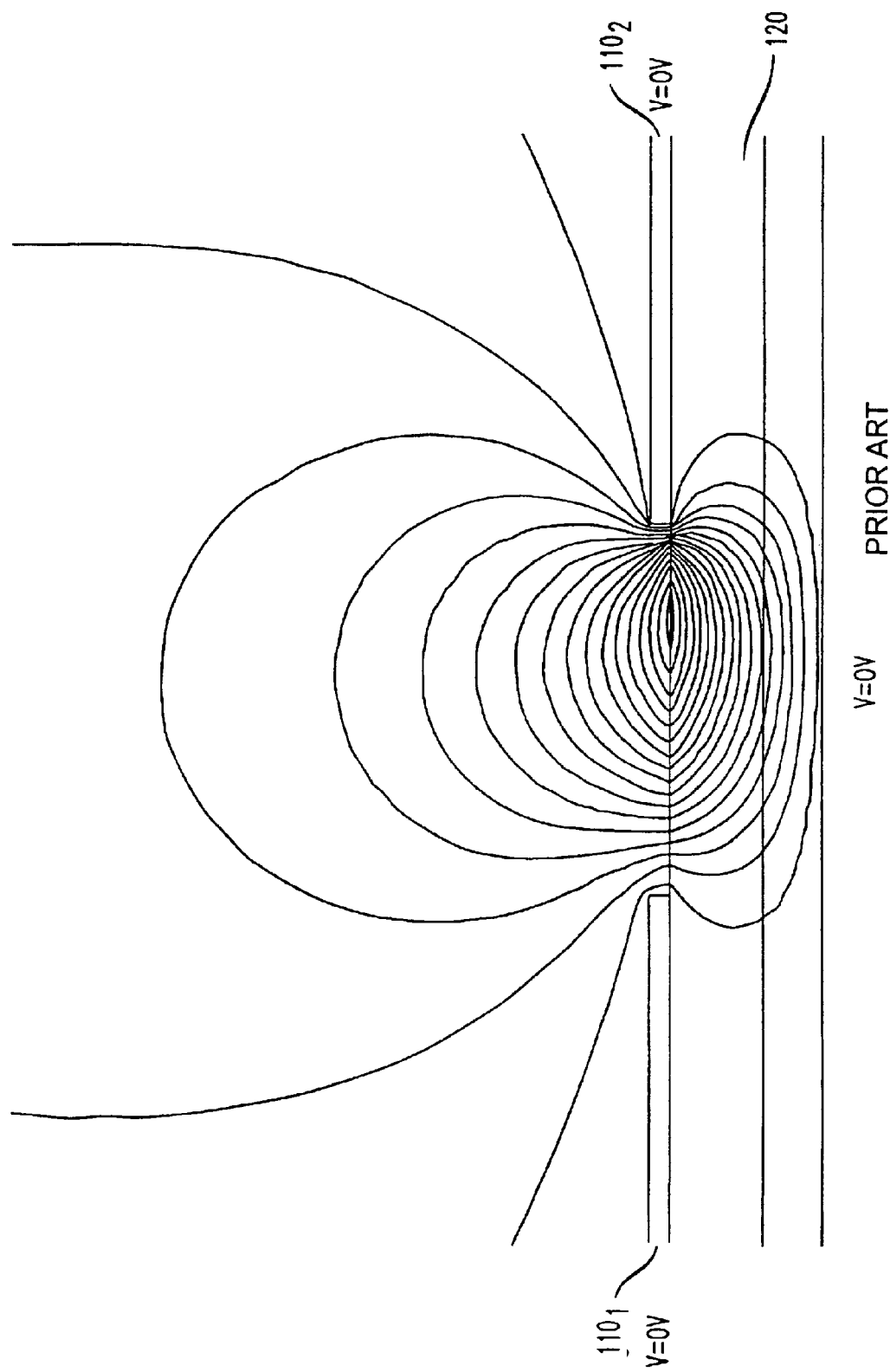
FIG. 2b graphically depicts a potential profile of the MEMS device of FIG. 2a after the applied voltage is removed.

FIG. 2b graphically depicts the potential profile above the dielectric layer 120 of the MEMS device 100 of FIG. 2a immediately after the applied voltage is removed. The profile of FIG. 2b illustrates the remnant electric field applied to the MEMS device 100 due to charging of the dielectric layer, which subsequently leads to the asymmetric discharging of the dielectric layer 120. FIG. 2b illustrates that the potential is pinned at zero at the two electrodes $110_1$ and $110_2$, and the potential peaks near ¼ of the width (w) of the electrode gap from the electrode $110_2$ that was at a high potential. The profile of FIG. 2b illustrates the inhomogeneous electric field of the MEMS device 100 in operation, which ultimately leads to the asymmetric discharging of the dielectric layer 120. Although initially the discharge is strongly peaked near the electrode with the high potential, with time the charge distribution decreases in magnitude and its peak shifts to the center. The potential for the dielectric layer 120 is not uniform because the geometry of the potentials applied to the electrodes $110_1$ and $110_2$ and the ground plane is highly asymmetric. Since the surface conductivity is poor, the time constant is long resulting in a slow discharging of the potential. It is thus apparent that the exposure of the dielectric layer 120 to an inhomogeneous electric field leads to a slow discharging of the dielectric layer 120, ultimately leading to drift in MEMS devices. In contrast, if the dielectric layer 120 were a surface conductor, the potential would drop uniformly from one electrode to the other because the geometry of a surface conductor is very homogeneous and the surface conductivity is good.

The inventor has determined that that there are 3 significant factors related to electrode geometry which affect the magnitude of the drift induced by the discharging of the dielectric layer: 1) the amount of exposed dielectric layer, 2) the extent of shielding between the dielectric layer and the electrostatically actuated device, and 3) the homogeneity of the electric field exposed to the dielectric layer. In understanding the effect of the electrode geometry and the properties of the exposed dielectric layer on the magnitude of the drift in MEMS devices, it has been determined by the inventor that the electrode thickness (h) only screens the effect of the surface potential from the MEMS mirror, but has little or no effect on the potential in the dielectric. The effects on the surface potential related to the gap dimensions, width (w) and depth (d), (in this case defining the dimensions of the exposed dielectric layer) can be decoupled from the screening effects caused by the electrode thickness (h). Briefly stated, the surface potential of the dielectric layer depends on the ratio w/d, while the effect on the electrostatically actuated device will be screened by the electrode thickness (h).

Figure 3:
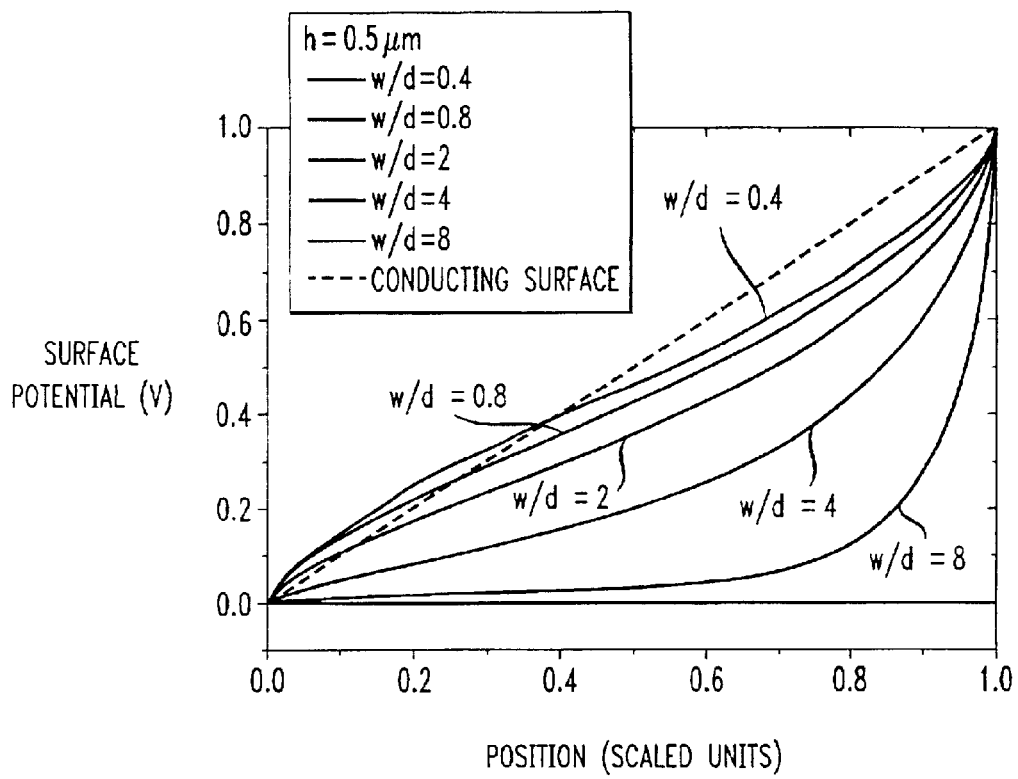
FIG. 3 graphically depicts the surface potential for a surface conductor versus the surface potential for various ratios of the gap dimensions, width (w) and depth (d) for the dielectric layer in the electrode gap.

FIG. 3 graphically depicts the surface potential for a surface conductor versus the surface potential for various ratios of the gap dimensions, width (w) and depth (d) for the dielectric layer in the electrode gap. As depicted in FIG. 3, the potential changes linearly in all cases for a surface conductor. However, for a dielectric layer, the potential is very non-linear for (w)>>(d) and increasingly linear (i.e. the electric field becomes uniform), for (w)<<(d). As the potential becomes increasingly uniform, the drift, or change in torque, applied to the electrostatically actuated device decreases due to the increase in the homogeneity of the electric field exposed to the dielectric layer in the gap. Since the initial potential is designed to be very linear, there is less change in the potential profile with time because the final potential profile after a long time delay is linear, as expected for a good surface conductor. Therefore, to reduce the drift in MEMS devices, methods of increasing the homogeneity of the electric field in the dielectric layer in MEMS devices have been proposed by the inventor in accordance with the present invention.

In an embodiment of the present invention, the width (w) of the electrode gap 150 of the MEMS device 100 of FIG. 1 is reduced to increase the homogeneity of the electric field seen by the dielectric layer 120 and consequently reduce the drift of the MEMS devices. In combination with this embodiment, the depth (d) of the dielectric layer 120 can also be increased to decrease the proportion w/d and further increase the homogeneity of the electric field ultimately seen by the dielectric layer 120, and consequently reduce the drift of the MEMS devices.

In another embodiment of the present invention, the drift in a MEMS device is advantageously reduced without the need to reduce the proportion of the width (w) of the dielectric layer to the depth (d) of the dielectric layer.

Figure 4:
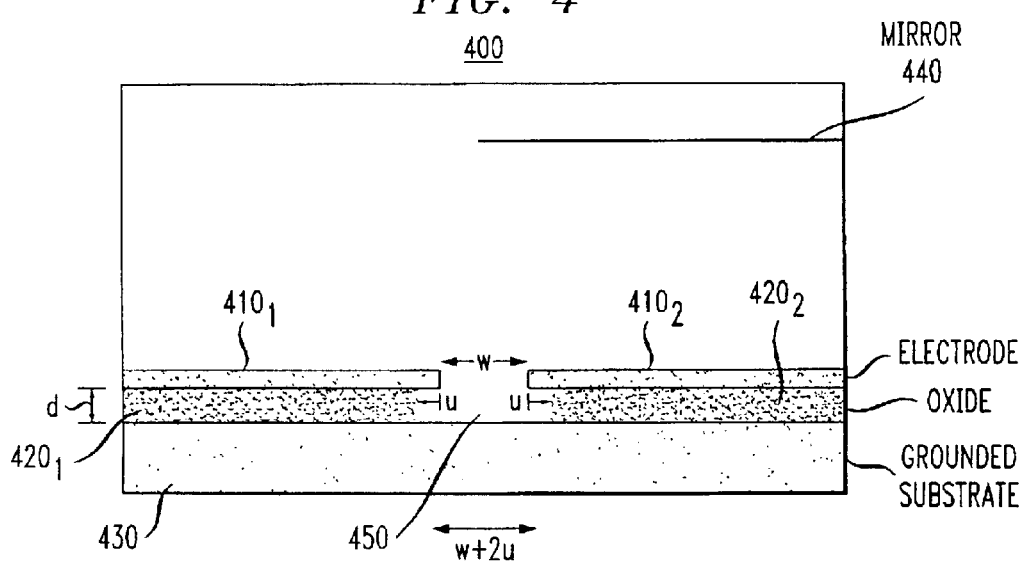
FIG. 4 depicts an embodiment of electrode geometry for a MEMS device in accordance with the present invention.

FIG. 4 depicts an embodiment of electrode geometry for a MEMS device in accordance with the present invention. The MEMS device 400 of FIG. 4 includes, two electrodes $410_1$ and $410_2$ as the conducting sections, a dielectric layer (illustratively a $SiO_2$ layer) divided into two sections $420_1$ and $420_2$ (collectively 420), a grounded substrate 430, and an electrostatically actuated device (illustratively a mirror) 440. A gap 450 between the two electrodes $410_1$ and $410_2$ separates the conducting sections and exposes the dielectric layer 420. The gap 450 is defined in terms of width (w) and depth (d). In the MEMS device 400 of FIG. 4, the dielectric layer 420 is etched away within the electrode gap 450 down to the grounded substrate 430. The dielectric layer 420 is also undercut by an amount (u), such that the electrodes $410_1$ and $410_2$ "hang over" the edge of the dielectric layer 420. Consequently, the dielectric surface is now vertical rather than horizontal. This has an effect similar to reducing the electrode gap 450 to the height (d) of the vertical sidewall. In the conventional geometry, it would be desirable to achieve w<<d to improve homogeneity, but in the electrode geometry depicted here, the role of (w) is taken on by the thickness (d), and the previous dimension (d) has become infinite, thus accounting for an increase in homogeneity. Accordingly, the amount of exposed dielectric can be quite small, typically 1 $\mu$m, as opposed to the 2–10 $\mu$m necessary in the conventional electrode geometry as depicted in the MEMS device 100 of FIG. 1 because the width (w) of the electrode gap 450 no longer determines the amount of the dielectric layer 420 exposed. One advantage of the proposed electrode geometry is that the use of simpler and possibly cheaper lithographic processes can now be used for fabricating the electrode structures with larger electrode gaps.

As the amount of undercut (u) of the dielectric is increased, the shielding and homogeneity improve exponentially. The improvement in homogeneity is the result of the increased uniformity of the electric field on the dielectric layer. The dielectric layer is now more symmetrically positioned between two conductors with a voltage drop across them and is exposed to a field similar to that provided by a parallel plate capacitor, which provides a uniform electric field. With the dielectric layer being exposed to a uniform electric field, the surface conductivity of the dielectric layer is now inconsequential because the electric field is homogeneous when the voltage is initially applied and consequently no change in torque is applied to the electrostatically actuated device. Consequently, the conductive properties of the dielectric layer are irrelevant. Although the electrode geometry of the MEMS device 400 of FIG. 4 provides a remedy for reducing the drift, all of the electrode wiring is exposed, which may be adequate for certain applications, but more stringent and/or complex applications may require a more complex geometry due to the wiring requirements of the electrodes.

Figure 5:
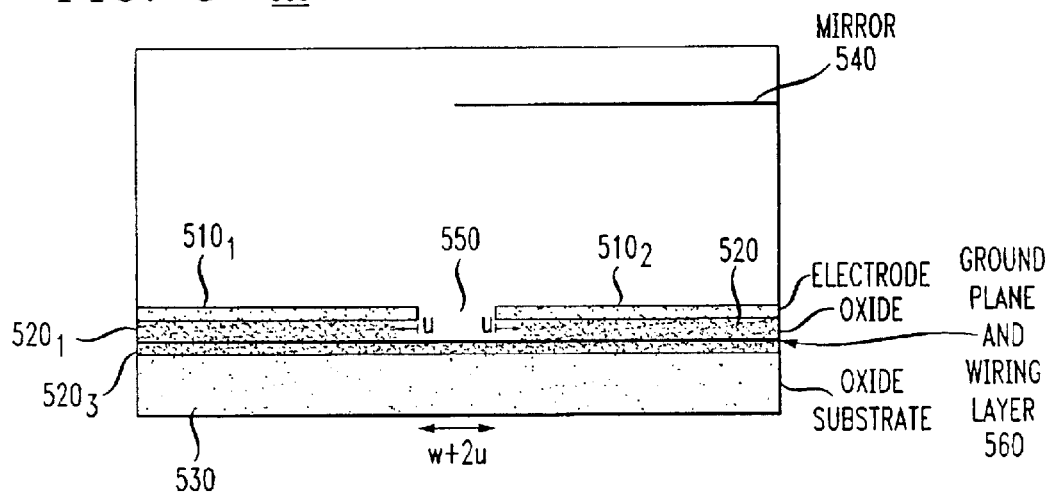
FIG. 5 depicts an embodiment of two-level metal electrode geometry for a MEMS device in accordance with the present invention.

FIG. 5 depicts an embodiment of two-level metal electrode geometry for a MEMS device in accordance with the present invention. The MEMS device 500 of FIG. 5 includes two electrodes $510_1$ and $510_2$ as the conducting sections, a dielectric layer (illustratively a $SiO_2$ layer) divided into three sections $520_1$, $520_2$, and $520_3$ (collectively dielectric layer 520), a grounded substrate 530, an electrostatically actuated device (illustratively a mirror) 540, and a combined ground plane and wiring layer 560 separating dielectric layers $520_1$ and $520_2$ from $520_3$. A gap 550 between the two electrodes $510_1$ and $510_2$ separates the conducting sections and exposes the dielectric layer 520. The gap 550 is defined in terms of its width (w).

In the MEMS device 500 of FIG. 5, the dielectric layer 520 is etched away within the electrode gap 550 such that the combined ground plane and wiring layer 560 is exposed. The dielectric layer 520 is also undercut by an amount (u), such that the electrodes $510_1$ and $510_2$ hang over the edge of the dielectric layer 520. The electrode geometry of the MEMS device 500 of FIG. 5 is almost identical to the geometry of the MEMS device 400 of FIG. 4 with the exception of the added combined, ground plane and wiring layer 560 and the added dielectric layer $520_3$ added to insulate the combined, ground plane and wiring layer 560 from the grounded substrate 530. The proposed MEMS device 500 of FIG. 5 contains all of the advantages described in the MEMS device 400 of FIG. 4. The added, combined ground plane and wiring layer 560 allows for more complex wire routing than in the electrode geometry of the MEMS device 400 of FIG. 4, but also often leaves some wires exposed through the dielectric.

Figure 6:
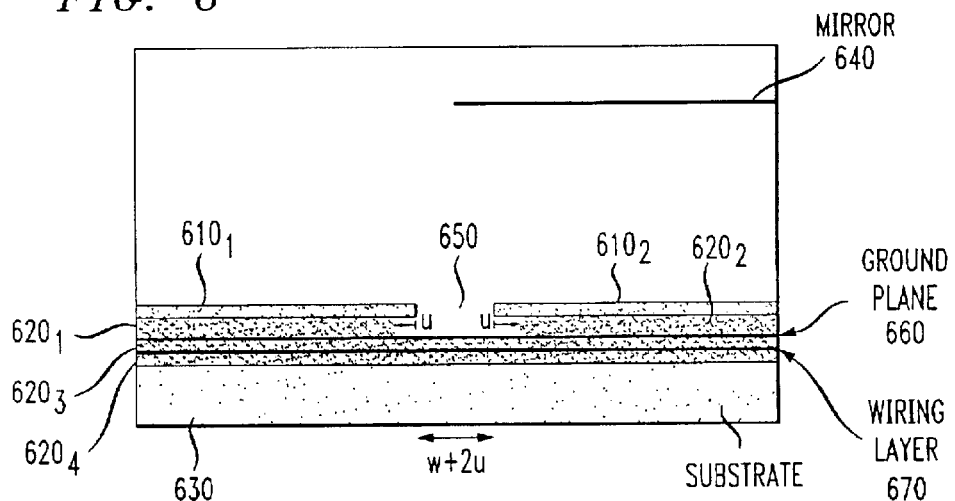
FIG. 6 depicts an embodiment of three-level metal electrode geometry for a MEMS device in accordance with the present invention.

FIG. 6 depicts an embodiment of three-level metal electrode geometry for a MEMS device in accordance with the present invention. The MEMS device 600 of FIG. 6 includes, two electrodes $610_1$ and $610_2$ as the conducting sections, a dielectric layer (illustratively a $SiO_2$ layer) divided into four sections $620_1$, $620_2$, $620_3$, and $620_4$ (collectively 620), a grounded substrate 630, an electrostatically actuated device (illustratively a mirror) 640, a ground plane 660, and a wiring layer 670. The ground plane 660 separates the dielectric layers $620_1$ and $620_2$ from $620_3$ and the wiring layer 670 separates dielectric layer $620_3$ from dielectric layer $620_4$. A gap 650 between the two electrodes $610_1$ and $610_2$ separates the conducting sections and exposes the dielectric layer 620. The gap 650 is defined in terms of its width (w). In the MEMS device 600 of FIG. 6, the dielectric layer 620 is etched away within the electrode gap 650 down to the ground plane 660. The dielectric layer 620 is also undercut by an amount (u), such that the electrodes $610_1$ and $610_2$ hang over the edge of the dielectric layer 620.

The electrode geometry of the MEMS device 600 of FIG. 6 is similar to the geometry of the MEMS device 400 of FIG. 4, with the notable exceptions of including the added ground plane 660, wiring layer 670, dielectric layer $620_3$ added to insulate the ground plane 660 from the wiring layer 670, and dielectric layer $620_4$ added to insulate the wiring layer 670 from the grounded substrate 630. The proposed MEMS device 600 of FIG. 6 contains all of the advantages described in the MEMS device 400 of FIG. 4. The wiring layer 670 allows for more complex wire routing than in the electrode geometry of the MEMS device 400 of FIG. 4, while the ground plane 660 allows the greatest functionality in terms of drift reduction with full shielding of the electrode wiring.

Figure 7:
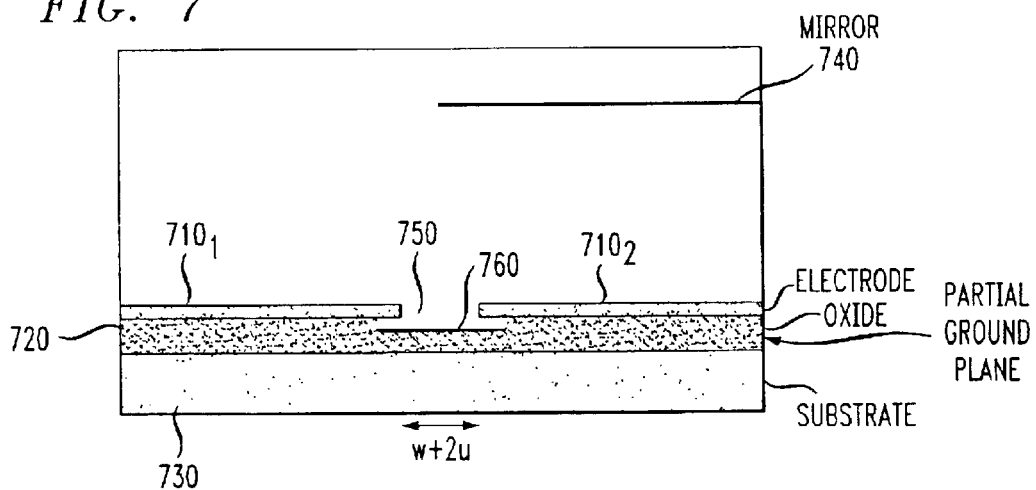
FIG. 7 depicts an embodiment of electrode geometry for a MEMS device, including a partial ground plane layer, in accordance with the present invention.

FIG. 7 depicts an embodiment of electrode geometry for a MEMS device, including a partial ground plane layer. The MEMS device 700 of FIG. 7 includes, two electrodes $710_1$ and $710_2$ as the conducting sections, a dielectric layer (illustratively a $SiO_2$ layer) 720, a grounded substrate 730, an electrostatically actuated device (illustratively a mirror) 740, and a partial ground layer 760. A gap 750 between the two electrodes $710_1$ and $710_2$ separates the conducting sections and exposes the dielectric layer 720. The gap 750 is defined in terms of its width (w). In the MEMS device 700 of FIG. 7, the dielectric layer 720 is partially etched away within the electrode gap 750 down to the partial ground layer 760. The dielectric layer 720 is also undercut by an amount (u), such that the electrodes $710_1$ and $710_2$ hang over the edge of the dielectric layer 720. Consequently, the exposed dielectric surface is now vertical rather than horizontal. The remaining exposed dielectric layer 720 is shielded by the partial ground layer 760. The effect of the electrode geometry of the MEMS device 700 of FIG. 7 is similar to that of the MEMS device 400 of FIG. 4. The homogeneity of the electric field that the dielectric layer 720 is exposed to is increased thus reducing the drift of the MEMS device 700 of FIG. 7. The partial ground layer 760 allows for the same advantages in the MEMS device 700 of FIG. 7 as in the MEMS device 400 of FIG. 4, without the need to etch the dielectric layer 720 to the grounded substrate 730.

The electrode geometries of the MEMS devices of FIGS. 4, 5, 6, and 7 share at least one common aspect. Specifically, in all of the proposed geometries, the homogeneity of the electric field that the dielectric layer is exposed to is increased. Since the dielectric layer acts as a surface conductor, the field across it will be uniform once the charges finally equilibrate. The design of an initially uniform electric field will result in no substantial change in electric field with time, and hence no substantial change in torque on the MEMS device. Therefore the design of an initially uniform electric field will reduce the drift on the MEMS device. The unique electrode geometries of the present invention, decrease the drift in the MEMS devices without the need to change the properties of the dielectric layer.

While the forgoing is directed to various embodiments of the present invention, other and further embodiments of the invention may be devised without departing from the basic scope thereof. As such, the appropriate scope of the invention is to be determined according to the claims, which follow.

What is claimed is:

1. Method for reducing drift in an electrostatically actuated device, said electrostatically actuated device including a dielectric material, for insulating conducting sections from a ground, said conducting sections being used to generate an electric field for controlling thereby the electrostatically actuated device, the method comprising:
   configuring a geometry of the dielectric material such that said electric field applied to exposed dielectric material comprises a substantially homogeneous electric field the configuring being achieved
   by reducing the surface area of the exposed dielectric material by reducing the width of a gap between said conducting sections, said gap exposing the surface of the dielectric material.

2. The method of claim 1, wherein said configuring comprises:
   removing the dielectric material within a gap between said conducting sections, said gap exposing the surface of the dielectric material, such that said exposed dielectric material is defined by vertical walls, substantially perpendicular to said gap and coextensive with the edges of said gap.

3. The method of claim 2, further comprising:
   undercutting the dielectric material relative to said gap between said conducting sections, such that the homogeneity of said electric field applied to the exposed dielectric material is increased.

4. The method of claim 1, wherein said electric field is applied to the exposed dielectric material in a homogeneous manner, such that when said electric field is applied, the electric field exposed to the dielectric material does not substantially change thereafter.

5. The method of claim 1, wherein the dielectric material is a material used for its property of supporting a difference in electric potential.

6. The method of claim 1, wherein said dielectric material is a nitride.

7. The method of claim 1, wherein said dielectric material is an oxide.

8. The method of claim 7, wherein the dielectric material is $SiO_2$.

9. Method for forming an electrostatically actuated device comprising:
   etching a dielectric material on a substrate such that an electric field applied to exposed dielectric material by conducting sections comprises a substantially homogeneous electric field,
   the etching resulting in reducing the surface area of the exposed dielectric material by reducing the width of a gap between said conducting sections, said gap exposing the surface of the dielectric material.

10. Geometry for reducing drift in an electrostatically actuated device, said electrostatically actuated device including a dielectric material, for insulating conducting sections from a ground, said conducting sections being used to generate an electric field for controlling thereby the electrostatically actuated device, comprising:
    said dielectric material, configured such that a surface area of the an exposed portion of said dielectric material is reduced by reducing the width of a gap between said conducting sections, said gap exposing the surface of the dielectric material such that said electric field applied to exposed dielectric material comprises a substantially homogeneous electric field.

11. The geometry of claim 10, wherein said electric field is applied to the exposed dielectric material in a homogeneous manner, such that when said electric field is applied, the electric field exposed to the dielectric material does not substantially change thereafter.

12. The geometry of claim 10, wherein the dielectric material is removed within a gap between said conducting sections, said gap exposing the surface of the dielectric material, such that said exposed dielectric material is defined by vertical walls, substantially perpendicular to said gap and coextensive with the edges of said gap.

13. The geometry of claim 12, wherein the dielectric material is undercut relative to said gap between said conducting sections, such that the homogeneity of said electric field applied to the exposed dielectric material is increased.

14. The geometry of claim 12, further comprising a partial ground plane.

15. The geometry of claim 12, further comprising a ground plane.

16. The geometry of claim 12, further comprising a wiring layer.

17. The geometry of claim 12, further comprising a combination ground plane and wiring layer.

18. An electrostatically actuated device, comprising:
    a dielectric material, for insulating conducting sections from a ground, said conducting sections being used to generate an electric field for controlling thereby the electrostatically actuated device; wherein
    a geometry of said dielectric material is adapted such that a surface area of an exposed portion of said dielectric material is reduced by reducing the width of a gap between said conducting sections, said gap exposing the surface of the dielectric material such that when said electric field is applied, the electric field exposed to the dielectric material does not substantially change thereafter.

* * * * *